US 9,246,454 B2

(12) United States Patent
Schirmann et al.

(10) Patent No.: US 9,246,454 B2
(45) Date of Patent: Jan. 26, 2016

(54) LOW POWER CONSUMPTION ADAPTIVE POWER AMPLIFIER

(71) Applicant: Google Technology Holdings LLC, Mountain View, CA (US)

(72) Inventors: Ernest Schirmann, Lake Zurich, IL (US); Ryan J. Geodken, Santa Clara, CA (US); Armin W. Klomsdorf, Chicago, IL (US); Thomas D. Nagode, Vernon Hills, IL (US)

(73) Assignee: Google Technology Holdings, LLC, Mountain View, CA (US)

( * ) Notice: Subject to any disclaimer, the term of this patent is extended or adjusted under 35 U.S.C. 154(b) by 65 days.

(21) Appl. No.: 14/108,544

(22) Filed: Dec. 17, 2013

(65) Prior Publication Data

US 2014/0266462 A1 Sep. 18, 2014

Related U.S. Application Data

(60) Provisional application No. 61/781,720, filed on Mar. 14, 2013.

(51) Int. Cl.
*H03F 3/60* (2006.01)
*H03F 1/02* (2006.01)
*H03F 3/72* (2006.01)

(52) U.S. Cl.
CPC ............... *H03F 3/602* (2013.01); *H03F 1/025* (2013.01); *H03F 1/0222* (2013.01); *H03F 1/0277* (2013.01); *H03F 3/72* (2013.01)

(58) Field of Classification Search
CPC .................... H03F 2200/102; H03F 2200/451; H03F 1/0227; H03F 1/0238; H03F 2200/105; H03F 2200/429; H03F 2200/432; H03F 3/191; H03F 3/195; H03F 3/245; H03F 1/00; H03F 1/0205; H03F 1/0222; H03F 1/0261; H03F 3/72; H03F 1/0277; H03F 1/0088; H03F 1/305; H03F 2200/294; H03F 2200/36; H03F 1/08; H03F 3/45475; H03G 3/3042; H03G 3/004
USPC ............. 330/51, 98, 133, 136, 310, 127, 297, 330/302
See application file for complete search history.

(56) References Cited

U.S. PATENT DOCUMENTS 6,639,462 B1   10/2003   Luu
7,151,411 B2 *  12/2006   Martin et al. ................. 330/305
(Continued)

FOREIGN PATENT DOCUMENTS

EP        1505725 B1    2/2005

OTHER PUBLICATIONS

European Patent Office, International Search Report and the Written Opinion of the International Searching Authority in International Patent Application PCT/US2014/018479 (Jul. 22, 2014).

*Primary Examiner* — Khanh V Nguyen
(74) *Attorney, Agent, or Firm* — Wolfe-SBMC

(57) ABSTRACT

An adaptive power amplifier that may be used in a wireless communication device is configured to adjust its load line or output impedance, the number of active amplifier cells in each amplification stage, the bias of the active amplifiers, and the supply voltage input capacitive load in accordance with a supply voltage modulation type provided to the power amplifier. The supply voltage modulation types include ET, APT, DC-DC, dual, multi-state or fixed voltage supply voltages. A supply voltage converter, signaled by a baseband processor, generates the selected type of supply voltage modulation for the adaptive power amplifier. The baseband processor may also provide a control interface signal to a controller within the adaptive power amplifier. The controller, based on the received control interface signal provides a configuration signal that configures the impedance, the number of active amplifier cells, the bias of the active amplifier cells, and the supply voltage capacitive load to optimize the adaptive power amplifier based on the supply voltage modulation type.

16 Claims, 3 Drawing Sheets

(56) References Cited

U.S. PATENT DOCUMENTS

| | | |
|---|---|---|
| 7,170,341 B2 | 1/2007 | Conrad et al. |
| 8,013,674 B2 * | 9/2011 | Drogi et al. ................. 330/136 |
| 2004/0075494 A1 | 4/2004 | Klomsdorf et al. |
| 2005/0030094 A1 | 2/2005 | Conrad et al. |
| 2010/0266066 A1 | 10/2010 | Takahashi |
| 2011/0070848 A1 * | 3/2011 | Ramachandra Reddy . 455/127.2 |

* cited by examiner

LOW POWER CONSUMPTION ADAPTIVE POWER AMPLIFIER

TECHNICAL FIELD

Embodiments are directed to a low power consumption adaptive power amplifier configurable to optimize transmitter efficiency for multiple supply voltage modulation modes. More particularly, a low power consumption adaptive power amplifier for use in a mobile communication devices is provided that is configurable to optimize transmitter efficiency by adjusting the power amplifier's impedance, bias, capacitance and transistor periphery based on the supply voltage to the power amplifier being provided according to one of a plurality of modulation types.

BACKGROUND

Many wireless communication protocols provide for transmitters, operating within a communication network, that are capable of transmitting at varying levels of output power. One reason for having varying level of output power is to accommodate the transmitter in wireless mobile communication devices such as wireless telephones, wireless personal data assistants (PDAs), pagers, two-way radios, and other types of wireless devices (all referred to herein as "User Equipment" or "UE"), which may be located at a varying distance from a base station.

Additionally, the increased data rates that have been enabled by modern mobile radio standards (e.g., LTE, HSPA, CDMA, WCDMA, WiMax) have placed increased demands on mobile device (UE) transmitters. While the maximum transmit power for a UE transmitter remains unchanged, the average transmit power of the UE's transmitter can be significantly higher than in the past. This increase in the average transmit power leads to significantly higher power consumption by the overall transmitter circuitry and to additional heat production from the transmitter circuitry due to inefficiencies of prior transmitter designs.

Additionally, multimode wireless devices are designed to transmit communication signals of different signal modulation schemes using a single power amplifier. Therefore, the single power amplifier must also be capable of transmitting at the power output levels required for each of the different RF modulation schemes associated with the modern radio standards (e.g., LTE, HSPA, CDMA, WCDMA, WiMax). Power amplifiers required to transmit signals of different modulation schemes are typically optimized for operation in only one of the various modulation schemes, such as non-linear modulation. As a result, when the power amplifier is amplifying a signal of another modulation scheme, such as linear modulation, the power amplifier is less efficient.

In some situations, different types of modulation schemes have been created with different techniques to provide a supply voltage to a power amplifier so as to make the power amplifier more efficient for the particular type of radio frequency (RF) modulation. One technique for providing voltage to a power amplifier (PA) is called envelope tracking (ET). ET is where the supply voltage to the PA follows or tracks the varying signal envelope of the RF signal that is to be amplified. Yet another technique for providing voltage to a PA is called average power tracking (APT). APT is where the supply voltage to the PA is adjusted based on the average power level of the varying RF signal to be amplified.

For example, when designing a PA to reduce power consumption when an envelope tracking technique is used, a typical PA design combines a standard buck converter to drive average current and a dynamic boost converter to drive envelope peaks. The maximum output voltage of the buck converter will be limited by the maximum voltage of the battery (Vbatt). Yet, the dynamic boost converter will allow the PA to drive voltage peaks (~3 dB) above Vbatt. The dynamic boost converter that is part of an envelope tracking modulator, which supplies the voltage for envelope tracking is sized to drive signal peaks only, but is not sized to provide the power needed when average power tracking (APT) is the mode of operation. Thus, when this design is used in an APT mode, the PA will be inefficient, clip some of the output signal peaks, and produce more heat.

In general, a power amplifier that is optimized for ET has a higher saturated power capability when compared to a more conventional power amplifier that uses average power tracking or a fixed voltage supply.

Referring to FIG. 1, a general graph of an Icc to Vcc response curve for a power amplifier output is shown. The Vcc is the input voltage to the power amplifier and the Icc is the current in the output of the power amplifier. The input voltage (Vcc) to output current (Icc) curve 110 is also referred to as the power amplifier's response curve 110. The power amplifier (PA) response curve 110 shown is only one representation of a family of PA response curves that result from a single PA. For simplicity, another PA response curve 112 is also shown. Other PA response curves, not specifically shown, may have different slopes in the low Vcc range and different maximum or saturated Icc outputs at the higher Vcc input levels depending, for example, on the bias applied to the PA amplifier stage(s) within the PA.

Two other curves are shown in FIG. 1. One of the curves is an envelope tracking (ET) load line 114. The other curve is an average power tracking (APT) and/or fixed voltage load line 116. The two load lines 114 and 116 are shown to exemplify that for envelope tacking (ET) the optimum load impedance 114 of a PA is very different from the optimum load impedance for an APT or fixed supply voltage load line 116 of the same PA. As such, it is clear that when a PA is designed for optimum performance as an ET PA, the same PA will be substantially less efficient when operated in APT or fixed voltage input situations. In other words, an APT PA, a fixed voltage PA and an ET PA will each have very different impedance load lines that will affect each of their designs so as to function optimally within the transmitter portion of a mobile communication device.

Yet, it has become common in mobile communication transmitters of UEs to require that an ET transmitter be backward compatible (i.e., able to operate in a non-ET mode). This ability for an ET transmitter to be backward compatible is important, for example, in situations where the transmitter supports multiple radio access technologies such as LTE, WCDMA, and CDMA, but wherein not all modes of PA supply voltage modulation for the radio access technologies are supported or configured to be an ET mode. Additionally, there are situations wherein, for example, a transmission of an LTE channel bandwidth is too large to be supported by ET techniques, such that non-ET techniques, such as APT or fixed voltage modulation technologies need to be used by a PA to amplify and transmit the large LTE channel bandwidth.

Additionally, DC-DC converters can be designed to provide the supply voltage (Vcc) to a PA. Such DC-DC converters can be designed to support and provide voltage to an optimized ET PA, meanwhile retain ATP functionality, but there is a much increased expense and component size associated with such a design, which greatly impacts the feasibility of DC-DC supply voltage converter designs. As indicated, PAs can be designed to support both ET and non-ET modes of operation, but in the past when doing so performance and efficiency of the resulting PA has always suffered.

What is needed is a transmit power amp that can be optimized for operation with linear, non-linear, multi-state, average power tracking, enhanced power tracking or envelope tracking modes of supply voltage modulation methods so as to provide an efficient low power consumption adaptive power amplifier regardless of the RF transmit mode of operation (e.g., LTE, WCDMA, CDMA, HSPA, WiMax, etc). Additionally, what is needed is a PA design that can be optimized during operation for ET performance, APT performance, fixed voltage performance, i.e., for multiple supply modulation modes, and maintain functionality and performance at the lowest cost and physical size.

BRIEF DESCRIPTION OF THE DRAWINGS

For a more complete understanding, reference is now made to the following description taken in conjunction with the accompanying Drawings in which.

DETAILED DESCRIPTION

Figure 1:
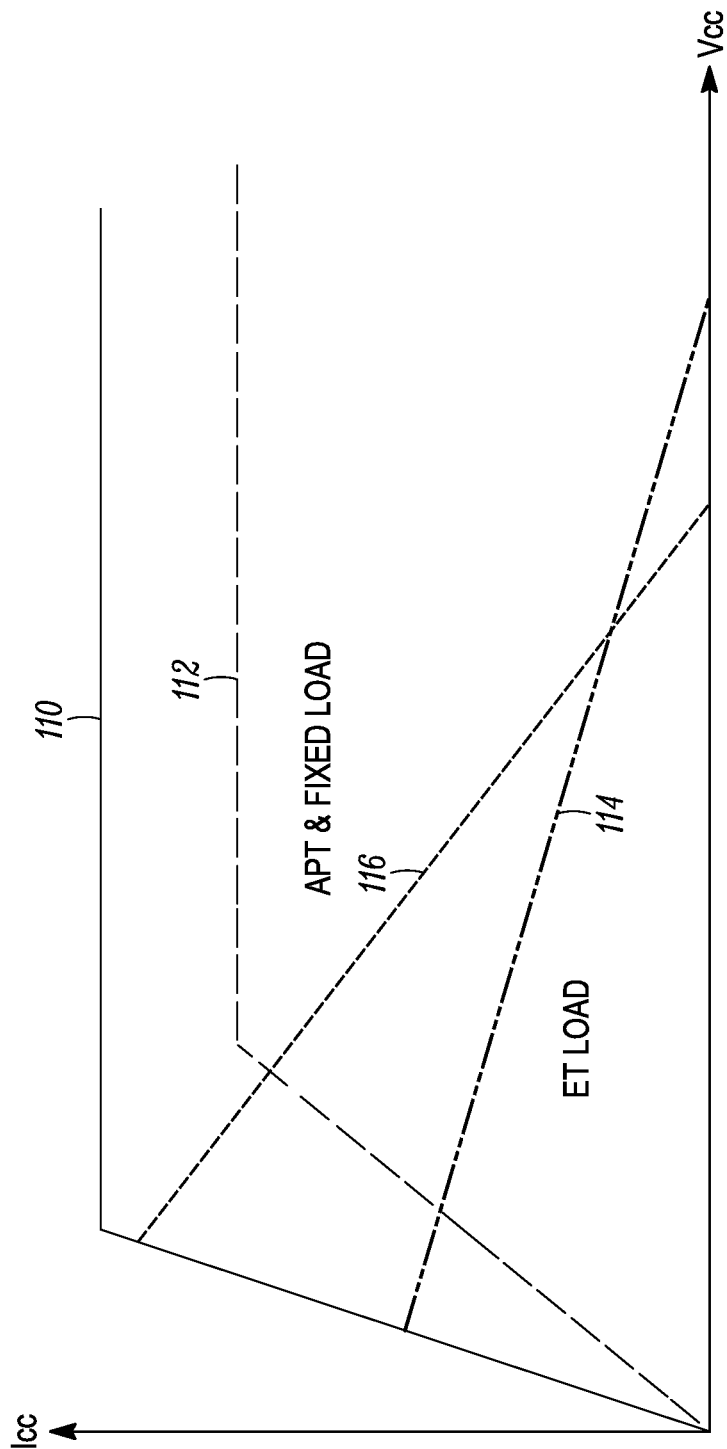
FIG. 1 illustrates a general Icc to Vcc response curve for a power amplifier.

Referring now to the drawings, wherein like reference numbers are used herein to designate like elements throughout, the various views and embodiments of a low power consumption adaptive power amplifier are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Power amplifiers (PAs) in mobile communication devices or UEs are expected to amplify transmission signals in multiple communication modes (e.g., LTE, CDMA, WCDMA, WiMAX, EDGE, etc.). UE's are often designed to operate in more than one communication mode. Even though a UE may be designed to operate in more than one communication mode, not all the communication modes may be supported within the UE so as to transmit the signal using a PA that is operating in an envelope tracking (ET) mode. As such, an exemplary PA is designed to operate optimally regardless of whether it is to operate in an ET mode or a non-ET mode. An exemplary PA is configurable to operate optimally in ET mode for, for example, an LTE modulation signal and then be reconfigured operate optimally in an APT mode when amplifying, for example, a CDMA signal.

Envelope tracking mode (ET) essentially means that the envelope of the modulated RF signal to be amplified is tracked such that a Vcc or supply voltage supplied to the PA tracks or varies with the amplitude of the modulated signal being tracked. Thus, ET is truly a supply voltage modulation method.

Average power tracking (APT) or enhanced average power tracking (EAPT) (herein both referred to as "APT") is not a pure supply voltage modulation method as it varies overtime with the average power of the RF signal that is being amplified. Regardless, for purposes of this document, APT and/or fixed voltage supplies are each also considered forms or different methods of supply voltage modulation that are provided to a PA by a supply voltage converter.

In theory, ET supply voltage modulation can be used with all wireless communication modes (e.g., LTE, CDMA, WCDMA, WiMAX, GSM, EDGE, etc.), but to date not all UE transmitter circuits support ET for all the potential wireless communication modes. An exemplary low power consumption adaptive power amplifier within the transmit circuitry of a UE is therefore configurable so as to operate efficiently regardless of the supply voltage modulation method used to provide the supply voltage, (Vcc), to the PA.

Exemplary low power consumption adaptive power amplifiers can be optimized during operation to produce an optimal configuration based on the power amplifier's supply voltage modulation method. An exemplary power amplifier (PA) comprises an adjustable load line (impedance), bias, transistor periphery, and input supply voltage capacitance so that the PA can be optimized to operate efficiently regardless of the supply voltage modulation method provided to the PA. The load, bias, transistor periphery and capacitance adjustments can each be made in a driver stage or final PA stage of the overall adaptive PA device. An exemplary PA can have its load line, bias, transistor periphery and input voltage supply capacitance programmed or configured by receiving a signal or configuration data from a mobile industry processor interface (MIPI), serial interface for radio frequency components, a general purpose output (GPO), parallel digital interface, other digital interface within a UE or be analog configured, for example, by a bias digital to analog converter (bias DAC). In yet other embodiments, the load impedance, bias, transistor periphery, and capacitance adjustments can be dynamically adjusted based on the transmission signal's amplitude and/or signal type (known cubic metric (CM) or peak-to-average-power-ratio (PAPR). When an exemplary PA is operating in ET mode, the load line impedance is made more resistive, while the bias and number of periphery transistors in the amplifier are decreased (with respect to operating in APT or fixed voltage modes). Conversely, in a more conventional mode of operation, such as APT or fixed voltage, the load line impedance is made less resistive and the bias and periphery transistors included in the amplifier are increased (with respect to operating in ET mode).

In one embodiment, a mobile communication device is provided that includes an adaptive power amplifier. The adaptive power amplifier has an RF output and a supply voltage input. The adaptive power amplifier also has a scalable amplifier stage operative to produce an RF output signal at the RF output. The scalable amplifier stage is also operative to adjust a number of active amplifiers in the scalable amplifier stage in response to a configuration signal. The configuration signal is based on the type of supply voltage modulation that is being provided to the supply voltage input. The adaptive amplifier further includes a variable output impedance that can be varied so as to change the line impedance or load impedance of the adaptive power amplifier in response to the configuration signal. Additionally, there is a bias adjustment capability or circuit that operates to vary the bias of the active amplifiers in the scalable amplifier stage in response to the configuration signal. This exemplary adaptive amplifier also has a voltage supply capacitance adjustment circuit that operates to adjust the input capacitance of the supply voltage input of the adaptive power amplifier in response to the configuration signal. There is also a controller in the adaptive power amplifier that is responsive to a control interface signal. The control interface signal, which originates from other circuitry in the mobile communication device, provides an indication of the supply voltage modulation type being used to supply or provide the supply voltage to the supply voltage input of the adaptive power amplifier. The controller uses the received control interface signal to look up in memory or generate the configuration signal.

In some embodiments, the mobile communication device also includes a supply voltage converter that operates to output the supply voltage to the supply voltage input of the adaptive amplifier. The supply voltage converter is further configured to selectively provide the supply voltage in one of a plurality of supply voltage modulation types being envelope tracking, average power tracking and a fixed or substantially fixed supply voltage.

In additional embodiments of the mobile communication device, when the supply voltage modulation type is envelope tracking, the voltage supply capacitance adjustment circuit is configured to adjust the input capacitance of the supply voltage input to an ET capacitance setting based on the configuration signal Additionally, when the supply voltage modulation type is average power tracking, the voltage supply capacitance adjustment circuit is configured to adjust the input capacitance of the supply voltage input to an APT capacitance setting. And, in this embodiment, the APT capacitance setting is a larger capacitance value than the ET capacitance setting.

In another embodiment, an adaptive power amplifier circuit is provided and operative to receive an RF input signal and produce an RF output signal. In this embodiment the adaptive power amplifier includes a supply voltage input and a controller. The controller has a control interface. The controller is configured to be responsive to a supply voltage modulation type data or signal received at the control interface. In response to receipt of the supply voltage modulation type data, the controller provides a configuration signal indicative of the supply voltage modulation type being provided to the supply voltage input of the adaptive power amplifier. The supply voltage modulation type can be one of at least two supply voltage modulation types. The adaptive power amplifier also includes a scalable amplifier stage that includes an output and a plurality of selectively activated amplifier cells or transistor cells. Each amplifier cell, when activated is operative to receive the RF input signal and produce an RF output. The scalable amplifier stage responds to the configuration signal by activating a predetermined number of selectively activatable amplifier cells based on the indicated supply voltage modulation type.

In additional embodiments, the adaptive power amplifier also includes a variable impedance circuit that is operative to vary the output impedance of the scalable amplifier stage as well as operatively responsive to the configuration signal so as to provide a predetermined output impedance based on the indicated supply voltage modulation type.

In yet other embodiments of the adaptive power amplifier circuit there is a bias adjustment circuit operative to adjust a bias of the activated amplifier cells. The bias adjustment circuit also responds to receipt of the configuration signal by adjusting the bias of the activated amplifier cells to a predetermined bias based on the indicated supply voltage modulation type.

An exemplary adaptive power amplifier circuit may also include a voltage supply capacitance adjustment circuit that operates to adjust the input capacitance of the supply voltage input and responds to the configuration signal by adjusting the input capacitance of the supply voltage input to a predetermined capacitance based on the indicated supply voltage modulation type. Furthermore, when the supply voltage modulation type is indicated as envelope tracking, the voltage supply capacitance adjustment circuit adjusts the input capacitance of the supply voltage input to an ET capacitance setting based on the configuration signal. Alternatively, when the indicated supply voltage modulation type is indicated as average power tracking, the voltage supply capacitance adjustment circuit adjusts the input capacitance of the supply voltage input to an APT capacitance setting wherein the APT capacitance setting has a higher or greater capacitance than the ET capacitance setting.

Another exemplary embodiment provides a wireless device. The exemplary wireless device includes a processor operative to produce a supply voltage modulation type data. The supply voltage modulation type data indicates the supply voltage modulation method that is being used to produce a modulated supply voltage for an adaptive power amplifier, which is also part of the wireless device.

The adaptive power amplifier has an output as well as a supply voltage input which is connected to receive the modulated supply voltage. Also included in the adaptive power amplifier is a controller that is responsive to the supply voltage modulation type data so as to selectively provide a configuration signal based thereon. The adaptive power amplifier also has a configurable amplifier stage that comprises a plurality of selectively activated amplifier elements. Each of the selectively activated amplifier elements, when activated is operative to produce an RF output signal at the output. Additionally, the configurable amplifier stage operatively responds to the configuration signal to activate a predetermined number of selectively activated amplifier cells. There is a variable impedance circuit in the adaptive power amplifier that operates to vary the output impedance of the configurable amplifier stage in response to the configuration signal. A bias adjustment circuit is included that is configured to adjust a bias of the activated amplifier cells to a predetermined bias in response to the configuration signal. There is also included a voltage supply capacitance adjustment circuit operative to adjust the input capacitance of the supply voltage input to a predetermined capacitance in response to the configuration signal.

The exemplary wireless device further includes an antenna operatively connected to the output of the adaptive power amplifier. The antenna is configured to transmit the RF output signal.

In some embodiments, the processor that produces the supply voltage modulation type data can be a baseband processor. While in other embodiments the processor is or is part of the transceiver circuitry.

In yet another embodiment, an amplification method is provided. The exemplary amplification method includes setting, by a processor, one of a plurality of supply voltage modulation types for a supply voltage converter to produce as a supply voltage for an adaptive power amplifier. The supply voltage converter can be configured to produce and output at least two different supply voltage modulation types, wherein the supply voltage modulation types can be selected from a group of supply voltage modulation types that include envelope tracking, average power tracking and a fixed supply voltage. The exemplary method selectively activates at least one selectively activatable amplifier cell within an amplifier stage of the adaptive power amplifier based on the set supply voltage modulation type used to provide the supply voltage for the adaptive power amplifier. The method further varies or adjusts the output impedance of the amplifier stage of the adaptive power amplifier to a predetermined output impedance based on the supply voltage modulation method that is being used to provide the supply voltage to the adaptive power amplifier. Also, the method comprises adjusting a bias of the at least one activated amplifier cell to a predetermined bias based on the supply voltage modulation method used to provide the supply voltage for the adaptive power amplifier, as well as adjusting a voltage supply capacitance of a supply voltage input on the adaptive power amplifier that receives the supply voltage to a predetermined capacitance based on the supply voltage modulation method used to provide the supply voltage for the adaptive power amplifier.

In an additional amplification method the voltage supply capacitance is adjusted to an ET capacitance when the supply voltage modulation type is set to envelope tracking and adjusted to an APT capacitance when the supply modulation type is set to average power tracking, wherein the APT capacitance is higher then the ET capacitance.

Figure 2:
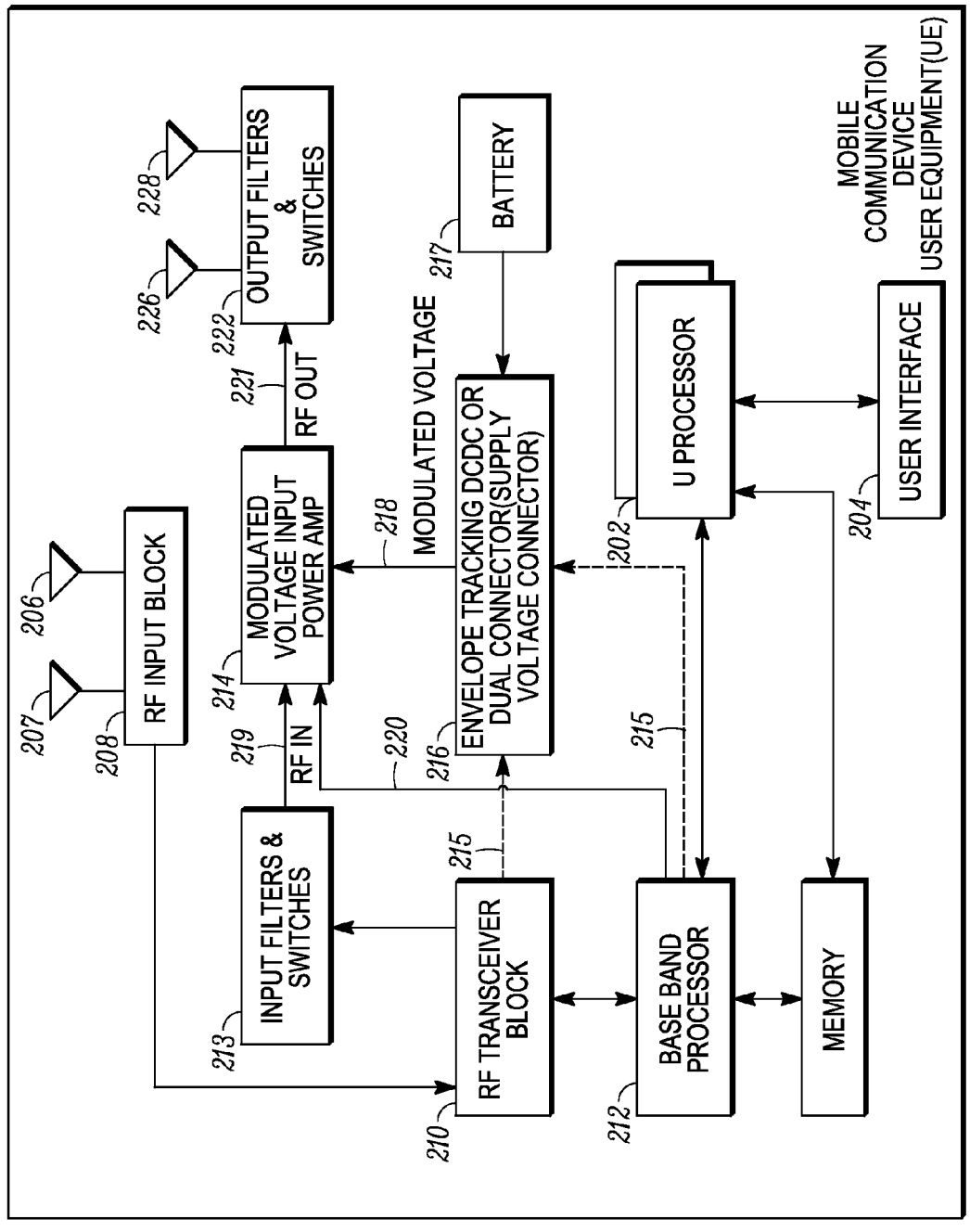
FIG. 2 is a block diagram of a mobile communication device incorporating a low power consumption adaptive power amplifier.

In FIG. 2 a mobile communication device or UE 200 is shown in a block diagram. One or more microprocessors 202 control the general overall functionality of the UE 200. A user interface 204 section, which may include buttons, switches, microphones, speakers a display screen, jacks and touch sensitive surfaces enable a user to interact with, control and operate the UE 200. The UE 200 may be configured to transmit and receive voice and data information via a plurality of different wireless communication protocols, including but not limited to one or more communication protocols being LTE, CDMA, WCDMA, WiMAX, GSM, EDGE, WiFi, Bluetooth®, and NFC. To receive wireless communications there may be one or more antennae 206, 207 adapted to receive one or more wireless communication protocols simultaneously. The received wireless communications are then provided to an RF input circuit 208 and then, in some embodiments, to a RF transceiver block 210 where a received signal or data is demodulated and provided to the baseband processor 212. The baseband processor further processes the received signal so it can be provided, via the microprocessor(s) 202 in a format (voice, data, video, other) discernable to the user of the UE 200.

When the UE 200 is to transmit a wireless signal the UE may, via the microprocessor 202, provide the baseband processor 212 a signal to be transmitted. The baseband processor receives the voice or data information to be transmitted from the microprocessor. The baseband processor processes the voice or data. The baseband processor provides the processed voice or data to the RF transceiver 210, which in turn provides an RF modulated signal via some input filters and switches 212 to an adaptive power amplifier 214.

In the meantime, either the baseband processor 212 or the RF transceiver 214 provides a modulation control signal 215, 215' to a supply voltage converter. The supply voltage converter, based on the modulation control signal 215, 215', uses power from the battery 217 to provide a modulated supply voltage 218 to the adaptive power amplifier 214. The modulated supply voltage may be (1) modulated to track the modulation envelope of the RF signal input 219 into the adaptive power amplifier (i.e., envelope tracking mode), (2) modulated to track the average power of the of the RF signal input 219 into the adaptive power amplifier (i.e., average power tracking mode) or (3) a substantially fixed voltage supply (i.e., fixed voltage mode). Furthermore, the baseband processor 212 provides to the adaptive power amplifier, a control interface signal 220 that informs the adaptive power amplifier of the modulation mode that the supply voltage converter using to provide the modulate supply voltage 218. The control interface signal 220 may be provided via a MIPI, serial interface, a GPO, a parallel interface or be analog configured by, for example a bias DAC.

The adaptive power amplifier 214 is configured to adjust its load impedance, bias, amplifier circuit(s) periphery, and supply voltage input capacitance in accordance with the supply voltage modulation mode indicated by the control interface signal 220 in order to optimize the overall adaptive power amplifier performance based on the supply voltage modulation method of the supply voltage converter.

The RF input signal 219 is then amplified efficiently by the optimized PA configuration of the adaptive power amplifier. The amplifier RF signal 221 is then output through some output filters and switches 222 to an appropriate transmit antenna 226 or 228.

Figure 3:
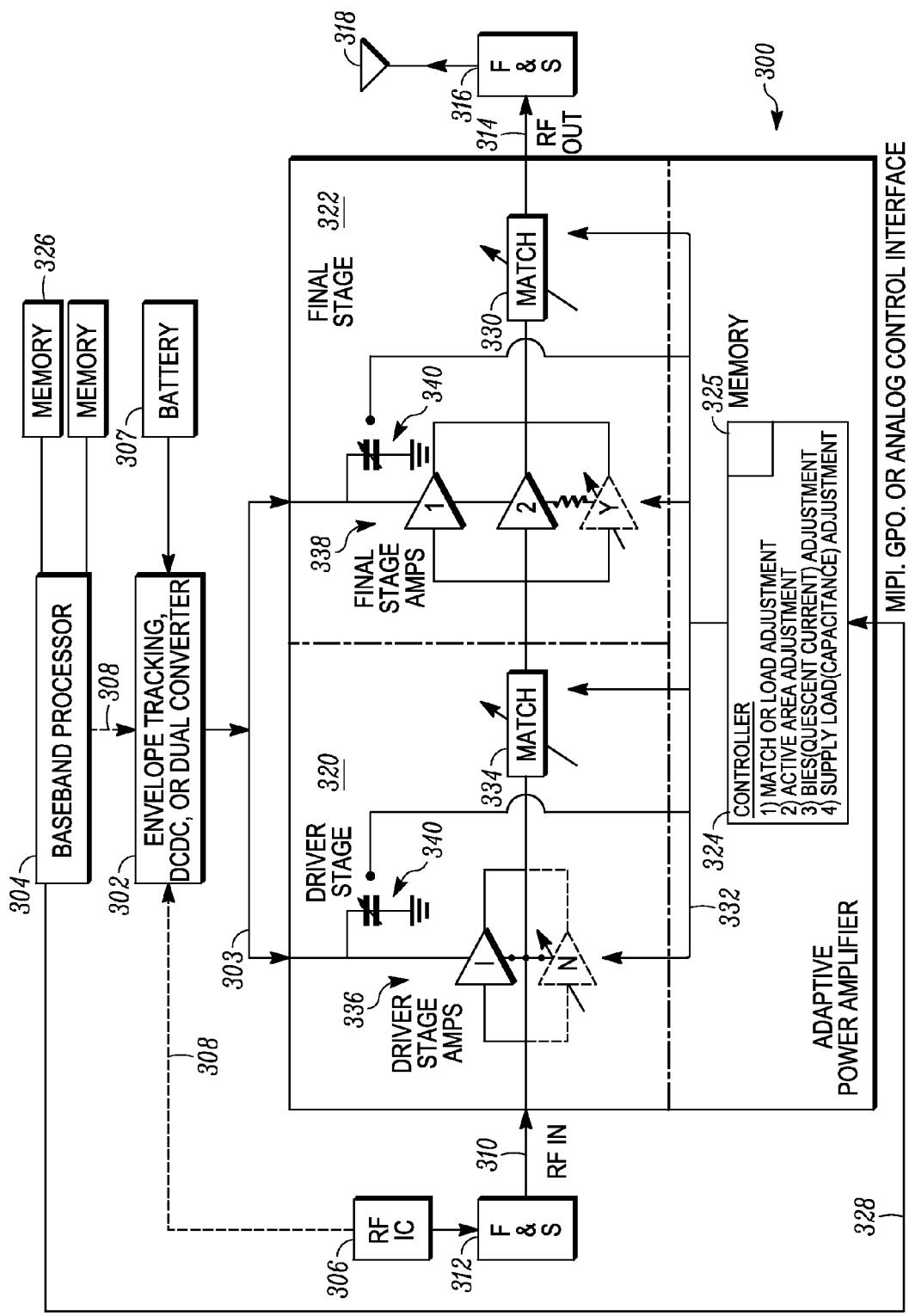
FIG. 3 is a block-schematic diagram of a low power consumption adaptive power amplifier.

FIG. 3, is a block schematic of an adaptive PA 300 in a transmitter circuit of a UE. A supply voltage converter 302 provides a supply voltage 303 to the adaptive PA 300 in the desired voltage modulation format. A battery 307, usually the battery of the UE, is connected to the supply voltage converter 302. In some configurations, a baseband processor 304 is connected to the supply voltage converter 302 to provide a modulation control signal 308, which controls how the supply voltage converter 302 will modulate the supply voltage 303, while in other configurations a RF block or circuit 306 provides the modulation control signal 308', which indicates or controls how the supply voltage 303 is to be modulated by the supply voltage converter 302. In the case where the modulation control signal 308 indicates that the supply voltage converter is to provide an APT mode voltage output, the modulation control signal 308 or 308' provides the information used to configure or set the supply voltage converter to provide a voltage that adjusts or changes in steps over time in accordance with the average power of the RF signal to be amplified.

The supply voltage converter 302 provides the supply voltage 303, being a voltage that is modulated for ET, APT, or a fixed voltage, in accordance with the UE's capability for tracking the particular transmission RF signal communication protocol being amplified (i.e., CDMA, LTE, WCDMA, etc.).

On the input side of the adaptive PA 300, there is an RF input 310 where the RF signal to be amplified is provided. The RF input signal is provided by the RF IC 306. The RF input signal goes through various input filters and switches 312 prior to being input at the RF input 310 of the adaptive PA 300.

At the output side of the adaptive PA 300, is an RF output 314 where the amplified RF signal is output. The amplified RF output signal goes through various output filters and switches 316 prior to being transmitted by the antenna 318.

The adaptive PA 300 shown has two stages being the driver stage 320 and the final stage 322. In other embodiments there may be more or less amplifier stages in the adaptive PA. Additionally, a controller circuit 324 is part of the adaptive PA 300. The controller circuit 324 may be microprocessor based or logically configured. In some embodiments the controller circuit may have memory 325 for storing decoding instructions or a look-up table indicating the configuration of the adaptive PA 300 based on an input from the control interface 328. The controller 324 is configured to receive control instructions from the baseband processor 304. The control instructions may be digital and be received in serial or parallel data formats. The control instructions from the baseband processor 304 inform the controller of the type of supply voltage modulation being provided to the adaptive PA 300 via the supply voltage connection 303. Based on the type of supply voltage modulation being provided, the controller 324 is configured to determine or look-up, using stored data in the memory 325, how to configure or reconfigure the driver stage 320 and final stage 322 of the adaptive PA 300. Alternatively, the memory may be a memory 326 associated with the baseband processor 304, wherein the baseband processor provides a configuration message via the control interface 328 that is interpreted logically by the controller 324 and used for configuring the adaptive PA 300 accordingly.

The output impedance 330 is adjusted in accordance with the supply voltage modulation method via the configuration signal 332 provided from the controller 324. Adjustment of the output impedance 330 is a major factor in how efficient the output 314 of the adaptive PA 300 will operate in ET mode, APT mode, fixed voltage mode or any other supply voltage modulation mode provided by the supply voltage converter 302. The optimum output impedance setting for the output impedance 330 is typically not the same for any of the various supply voltage modulation modes and/or transmission modulation protocols. For example, in ET mode, the output impedance 330 is set to make the PA 300 have a higher saturated power level than when in APT mode. Conversely, when operation in APT mode, the output impedance will be set so the PA 300 will have a lower saturation power level (than when in ET mode) and is further adjusted to minimize output signal distortion as the PA output hits compression. Most Pas have a linear range of operation weher Pout (dBm)=Pim (dBm)+Gain (dB), where Gain essentially remains constant. A PA is understood to "hit compression" when the Gain begins to drop due to PA saturation, for example a Pas 2 dB compression point is the Pout at which the Gain has dropped by 2 dB.

The output impedance 330 is set based on the supply voltage modulation type or method, as well as on the signal frequency, magnitude and the impedance seen from the output filters and switches 316 and antenna 318.

The driver stage impedance 334 is set to match the output impedance of the one or more driver stage amplifier(s) 336 to the input impedance of the one or more final stage amplifiers 338. For example, for ET mode or for the amount of power to be output by the PA 300, there may be more or less amplifiers or transistor cells that are configured to be active in each stage of the adaptive PA 300. As such, the driver stage impedance 334 between the driver stage 320 and the final stage 322 is matched based, at least on, the power supply voltage modulation method so that there is an optimum impedance match between the output of the driver stage amplifier(s) and the input of the final stage amplifier(s) 338.

The controller 334 is also configured to provide the configuration signal 332 to adjust the active periphery or area of the driver stage and final stage amplifiers 336, 338. The configuration signal 332 adjusts the number of amplifiers or transistor cells that are combined in the driver and final stages of the adaptive 300 power amplifier according to the supply voltage modulation type being provided by the supply voltage converter 302. As depicted in FIG. 3, an adaptive PA 300 can be configured or optimized to have 1 to N driver stage amplifiers 336. The adaptive PA 300 can also be configured or optimized to have 1 to Y final stage amplifiers 338. The driver stage amplifier section 336 and final stage amplifier section 338 are made up of transistor or amplifier cells that can be selectively connected/combined and activated to increase the transistor periphery or size of the relevant amplifier section according to the supply voltage modulation method. Increasing the periphery can increase the overall amplification, decrease the distortion, expand the peak-to-peak range or increase the Q (quality) of the overall amplifier stage. Additionally, increasing the number of amplifiers in a stage increases the output power capability of the device.

The controller 324 is further configured to adjust the bias of each active driver stage and final stage amplifier 336, 338 in accordance with the supply voltage modulation method that was set by the baseband processor 304. The controller sets the bias via the configuration signal 332. The bias is adjusted to optimize the bias that sets the quiescent current for each amplifier in the adaptive amplifier 300.

The controller 324 is also configured to adjust the capacitance of the supply voltage capacitors 340. When the supply voltage converter 302 provides a supply voltage 303 that is a non-ET mode voltage, such as APT or a fixed voltage output, the supply voltage capacitors are set to a relatively high capacitance setting by the controller 324 via the configuration signal 332. The reason for the relatively high capacitance setting is so the supply voltage capacitors 340 will operate like low pass filters and "clean" or remove the high frequency spikes or noise that may be present in the supply voltage 303. High frequency spikes or noise in the supply voltage 303 may increase the noise or distortion introduced to the RF signal as it is amplified by the adaptive power amplifier 300. These high frequency spikes or noise can also lead to amplifier instability. Conversely, when operating in ET mode, the controller 324 is configured to adjust and minimize the capacitance of the supply voltage capacitors 340 to a capacitance that is below or substantially below the capacitance setting used in the APT or fixed supply voltage modes. The reason for minimizing or setting the capacitance of the supply voltage capacitors 340 to a capacitance that is below or substantially below the capacitance setting used in non-ET modes is because when in ET mode the supply voltage is varying at a high rate of change with the envelope of the RF signal being tracked. Thus, one does not want a low pass filter on the supply voltage within a cut-off that is at as low a frequency as when in a non-ET mode. If the capacitance is not minimized, the output of the supply voltage converter 302, when operating in ET mode, will be loaded such that the supply voltage 303 may not efficiently track the rapidly changing voltage variations or high frequency changes of the RF signal envelope being tracked. As such, the adaptive PA 300 adjusts and optimizes the capacitance of the supply voltage capacitors via the configuration signal from the controller 324 based on the supply voltage modulation method or type being provided to the adaptive power amplifier 300.

An exemplary adaptive power amplifier, such as the one depicted in FIG. 3, adjusts the impedance, the transistor or amplifier periphery, the bias to the active amplifiers, and the supply voltage capacitive load in accordance with a supply voltage modulation mode that is being provided to the power amplifier. The supply voltage modulation modes may be ET, APT, DC-DC, Dual or fixed voltage outputs provided by a supply voltage converter 302. The supply voltage converter may be signaled by a baseband processor or RF IC circuitry as to the type of supply voltage modulation output to provide the adaptive power amplifier. The baseband processor or in some configurations the RF IC circuitry also provide a control interface signal to a controller within the adaptive power amplifier. The controller, based on the control interface signal received provides a configuration signal that, configures or reconfigures the impedance, the transistor or amplifier periphery, the bias to the active amplifiers, and the supply voltage capacitive load to be optimized for the type of supply voltage modulation being provided to the power amplifier.

It will be appreciated by those skilled in the art having the benefit of this disclosure that this low power consumption adaptive power amplifier provides a mobile communication device with a power amplifier that is adaptively configurable to provide amplification to an RF signal in an efficient manner regardless of the voltage supply modulation method used to power the power amplifier. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A mobile communication device comprising:
an adaptive power amplifier comprising:
a RF output;
a supply voltage input;
a scalable amplifier stage operative to produce an RF output signal at the RF output and operative to adjust a number of amplifiers in the scalable amplifier stage in response to a configuration signal that is based on a supply voltage modulation type provided to the supply voltage input;
a variable impedance operative to vary the line impedance of the adaptive power amplifier in response to the configuration signal that is based on the supply voltage modulation type provided to the supply voltage input;
a bias adjustment operative to vary a bias of the amplifiers in the scalable amplifier stage in response to the configuration signal that is based on the supply voltage modulation type provided to the supply voltage input;
a voltage supply capacitance adjustment circuit operative to adjust the input capacitance of the supply voltage input of the adaptive power amplifier in response to the configuration signal that is based on the supply voltage modulation type provided to the supply voltage input; and
a controller operatively responsive to a control interface signal, the control interface signal providing an indication of the supply voltage modulation type being used to supply a supply voltage to the supply voltage input of the adaptive power amplifier, the controller configured to provide the configuration signal.

2. The mobile communication device of claim 1, further comprising a supply voltage converter operative to output the supply voltage to supply voltage input of the adaptive amplifier, the supply voltage converter configured to selectively provide the supply voltage in one of a plurality of supply voltage modulation types.

3. The mobile communication device of claim 2, wherein the plurality of supply voltage modulation types comprise an envelope tracking (ET) modulation type and an average power tracking (APT) modulation type.

4. The mobile communication device of claim 1,
wherein when the supply voltage modulation type is envelope tracking, the voltage supply capacitance adjustment circuit adjusts the input capacitance of the supply voltage input to an Envelope Tracking (ET) capacitance setting based on the configuration signal; and
wherein when the supply voltage modulation type is average power tracking, the voltage supply capacitance adjustment circuit adjusts the input capacitance of the supply voltage input to an Average Power Tracking (APT) capacitance setting,
wherein the APT capacitance setting is greater than the ET capacitance setting.

5. The mobile communication device of claim 1, further comprising a baseband processor configured to provide the control interface signal to the controller.

6. An adaptive power amplifier circuit operative to receive an RF input signal and to produce an RF output signal, the adaptive power amplifier comprising:
a supply voltage input;
a controller, comprising a control interface, the controller configured to be responsive to a supply voltage modulation type data received at the control interface and in response thereto, to provide a configuration signal indicative of a supply voltage modulation type being provided to the supply voltage input, the supply voltage modulation type comprising one of at least two supply voltage modulation types; and
a scalable amplifier stage including an output and a plurality of selectively activated amplifier cells, each amplifier cell when activated operative to receive the RF input signal and each when activated operative to produce the RF output signal at the output, wherein the scalable amplifier stage operatively responds to the configuration signal to activate a predetermined number of selectively activated amplifier cells based on the indicated supply voltage modulation type.

7. The adaptive power amplifier circuit of claim 6, further comprising:
a variable impedance operative to vary the output impedance of the scalable amplifier stage and operatively responsive to the configuration signal to provide a predetermined output impedance based on the indicated supply voltage modulation type.

8. The adaptive power amplifier circuit of claim 6, further comprising:
a bias adjustment operative to adjust a bias of the selectively activated amplifier cells and operatively responsive to the configuration signal to adjust the bias of the selectively activated amplifier cells to a predetermined bias based on the indicated supply voltage modulation type.

9. The adaptive power amplifier circuit of claim 6, further comprising:
a voltage supply capacitance adjustment circuit operative to adjust the input capacitance of the supply voltage input and operatively responsive to the configuration signal to adjust the input capacitance of the supply voltage input to a predetermined capacitance based on the indicated supply voltage modulation type.

10. The adaptive power amplifier circuit of claim 9, wherein when the indicated supply voltage modulation type is envelope tracking, the voltage supply capacitance adjustment circuit adjusts the input capacitance of the supply voltage input to an Envelope Tracking (ET) capacitance setting based on the configuration signal; wherein when the indicated supply voltage modulation type is average power tracking, the voltage supply capacitance adjustment circuit adjusts the input capacitance of the supply voltage input to an Average Power Tracking (APT) capacitance setting, and wherein the APT capacitance setting is greater than the ET capacitance setting.

11. A wireless device comprising:
a processor operative to produce a supply voltage modulation type data, the supply voltage modulation type data indicative of a supply voltage modulation used to produce a modulated supply voltage;
an adaptive power amplifier comprising:
an output;
a supply voltage input operative to receive the modulated supply voltage, a controller responsive to the supply voltage modulation type data to selectively provide a configuration signal based thereon;

a configurable amplifier stage comprising a plurality of selectively activated amplifier elements, each amplifier element when activated operative to produce an RF output signal at the output, wherein the configurable amplifier stage operatively responds to the configuration signal to activate a predetermined number of selectively activated amplifier cells;

a variable impedance operative to vary the output impedance of the configurable amplifier stage in response to the configuration signal;

a bias adjustment operative to adjust a bias of the activated amplifier cells to a predetermined bias in response to the configuration signal;

a voltage supply capacitance adjustment circuit operative to adjust the input capacitance of the supply voltage input to a predetermined capacitance in response to the configuration signal; and an antenna operatively connected to the output of the adaptive power amplifier and operative to transmit the RF output signal.

12. The wireless device of claim 11, wherein the processor is a baseband processor.

13. The wireless device of claim 11, wherein the processor is an RF transceiver.

14. The wireless device of claim 11, wherein the supply voltage modulation used to produce the modulated supply voltage comprises at least two of envelope tracking, average power tracking and fixed voltage.

15. An amplification method comprising:

setting, by a processor, one of a plurality of supply voltage modulation types for a supply voltage converter to produce as a supply voltage for an adaptive power amplifier, wherein the supply voltage converter is configurable to produce at least two different supply voltage modulation types selected from a group of supply voltage modulation types comprising envelope tracking, average power tracking and fixed supply voltage;

selectively activating at least one selectively activated amplifier cell within an amplifier stage of the adaptive power amplifier based on the set supply voltage modulation type used to provide the supply voltage for the adaptive power amplifier;

varying the output impedance of the amplifier stage of the adaptive power amplifier based on a supply voltage modulation method used to provide the supply voltage to the adaptive power amplifier;

adjusting a bias of the at least one activated amplifier cell to a predetermined bias based on the supply voltage modulation method used to provide the supply voltage for the adaptive power amplifier; and adjusting a voltage supply capacitance of a supply voltage input on the adaptive power amplifier that receives the supply voltage to a predetermined capacitance based on the supply voltage modulation method used to provide the supply voltage for the adaptive power amplifier.

16. The amplification method of claim 15, further comprising adjusting the voltage supply capacitance of the supply voltage input to an Envelope Tracking (ET) capacitance when the supply voltage modulation type is set to envelope tracking and to an Average Power Tracking (APT) capacitance when the supply modulation type is set to average power tracking, wherein the APT capacitance is higher than the ET capacitance.

* * * * *

UNITED STATES PATENT AND TRADEMARK OFFICE
CERTIFICATE OF CORRECTION

| | | |
|---|---|---|
| PATENT NO. | : 9,246,454 B2 | Page 1 of 1 |
| APPLICATION NO. | : 14/108544 | |
| DATED | : January 26, 2016 | |
| INVENTOR(S) | : Schirmann et al. | |

It is certified that error appears in the above-identified patent and that said Letters Patent is hereby corrected as shown below:

On the title page item [72], line 2, after "Ryan J." delete "Geodken", insert -- Goedken --, therefor.

Signed and Sealed this
Nineteenth Day of April, 2016

Michelle K. Lee
*Director of the United States Patent and Trademark Office*